United States Patent [19]
Wolf et al.

[11] Patent Number: 5,541,422
[45] Date of Patent: Jul. 30, 1996

[54] TUNNEL DIODE WITH SEVERAL PERMANENT SWITCHING STATES

[75] Inventors: Ronald M. Wolf; Paulus W. M. Blom; Marcellinus P. C. M. Krijn, all of Eindhoven, Netherlands

[73] Assignee: U.S. Philips Corporation, New York, N.Y.

[21] Appl. No.: 353,844

[22] Filed: Dec. 12, 1994

[30] Foreign Application Priority Data

Dec. 10, 1993 [BE] Belgium ................... 09301369

[51] Int. Cl.$^6$ ..................... H01L 29/06
[52] U.S. Cl. ............... 257/9; 257/35; 257/295; 365/145
[58] Field of Search ............. 257/35, 46, 104, 257/105, 295, 310, 480, 485, 910, 9; 359/58, 60; 365/145

[56] References Cited

U.S. PATENT DOCUMENTS 5,206,788 4/1993 Larson et al. ................... 257/295

OTHER PUBLICATIONS

L. Esaki et at, "Polar Switch", IBM Technical Disclosure Bulletin, vol. 13, No. 8, Jan. 1971, p. 2161.
L. L. Chang et al, "Nonvolatile Schottky Diode With Barrier Height Controlled By Ferroelectric Polarization", IBM Technical Disclosure Bulletin, vol. 14, No. 4, Sep. 1971, pp. 1250–1251.
S. M. Sze, "Physice of Semiconductor Devices", Chapter 9—Tunnel Devices, pp. 513–562, John Wiley & Sons, New York, 1981.

*Primary Examiner*—Rolf Hille
*Assistant Examiner*—Minhloan Tran
*Attorney, Agent, or Firm*—Arthur Schaier

[57] ABSTRACT

The invention relates to a tunnel diode provided with two metallically conducting electrodes (1, 2) with an insulating dielectric (3) in between, which forms a barrier with a barrier level for electrons and which has a thickness such that electrons can tunnel through the barrier from the one to the other electrode. Such a tunnel diode has the disadvantage that it has no memory. In many applications it is desirable for the tunnel diode to hold a certain switching state, such as open/closed. According to the invention, the tunnel diode is characterized in that the dielectric (3) comprises a layer of a material which is ferroelectric at room temperature with a remanent polarization which influences the barrier level. It is achieved thereby that the tunnel diode has various switching states in dependence on the remanent polarization of the dielectric (3). The switching state is maintained until the polarization of the dielectric (3) changes.

12 Claims, 3 Drawing Sheets

TUNNEL DIODE WITH SEVERAL PERMANENT SWITCHING STATES

The invention relates to a tunnel diode provided with two metallically conducting electrodes with an insulating dielectric in between which forms a barrier with a barrier level for electrons and which has a thickness such that electrons can tunnel through the barrier from the one to the other electrode at a voltage higher than a threshold voltage. The invention also relates to a memory element.

BACKGROUND OF THE INVENTION

Such a tunnel diode is known from: S. M. Sze: Physics of semiconductor devices, chapter 9: Tunnel devices. The tunnel diode is also known as an MIM ("metal-insulator-metal") or MIS ("metal-insulator-semiconductor") diode, where "metal" is understood to mean a well-conducting material. Electrons can tunnel from the one the other electrode, given a voltage across the electrodes in excess of the threshold voltage. The electrons cannot tunnel across the barrier at a voltage below the threshold voltage. Such switching elements are highly suitable for use at high frequencies.

The known tunnel diode described has the disadvantage that it has no memory. It is desirable in many applications for the tunnel diode to retain a certain switching state, such as open/closed, under practical conditions such as room temperature.

SUMMARY OF THE INVENTION

The invention has for its object inter alia to counteract the said disadvantage.

According to the invention, the device is for this purpose characterized in that the dielectric comprises a layer of a material which is ferroelectric at room temperature with a remanent polarization which influences the barrier level.

It is achieved thereby that the tunnel diode has several switching states depending on the remanent polarization of the dielectric. The value and the direction of the polarization influence the barrier level; or, in other words, the shape of the barrier is changed by the remanent polarization of the ferroelectric dielectric. Given a certain voltage at the electrodes, more or fewer electrons can then tunnel through the dielectric depending on the barrier level, so that more or less tunnel current can flow through the tunnel diode. The tunnel diode accordingly has several switching states. The ferroelectric dielectric may be switched from one polarization state to another in that a voltage is applied across the dielectric such that an electric switching field of the ferroelectric material is achieved in the dielectric. The switching state is held until the polarization state of the dielectric changes.

The thickness of the dielectric may be comparatively great if there are so-called "traps" in the dielectric through which electrons can tunnel through the dielectric ("trap assisted tunnelling"). Such a dielectric, however, is difficult to manufacture in a reproducible manner. Preferably, the thickness of the layer of ferroelectric material is taken to be below 100 Å. Tunnelling of electrons through the dielectric is then possible at comparatively low voltages without the aid of traps. A diode characteristic is no longer obtained at very small thicknesses of the layer of ferroelectric material, the diode behaving like a fixed, low resistance instead. Preferably, the thickness of the layer of ferroelectric material is greater than 20 Å in order to obtain a diode characteristic.

The remanent polarization in the layer of ferroelectric material may have different values in different directions, depending on the structure of the layer. The value and direction of the remanent polarization strengthen or weaken the influence of an electric field to be applied between the electrodes, and thus influence the barrier level and the tunnel current. Preferably, the two electrodes take the shape of practically parallel plates and the direction of a greatest component of the remanent polarization is substantially perpendicular to the plates. When a voltage is applied across the electrodes now, the direction of this greatest component of the remanent polarization is parallel or antiparallel to the electric field between the electrodes. The effect of the polarization on the level and width of the barrier is at its greatest then. Such a material is obtained when the layer of ferroelectric material, i.e. the ferroelectric dielectric, is provided epitaxially on an electrode of a monocrystalline, metallically conducting oxide. The growing direction of the layer of ferroelectric material is so chosen then that a preferred polarization axis of the ferroelectric material, which indicates the direction of the greatest component of the remanent polarization, is substantially perpendicular to the plates. The dielectric then has a structure such that the remanent polarization is at its greatest, while the direction of the polarization is parallel to the electric field to be applied between the electrodes. The metallically conducting oxide layers comprise, for example, known monocrystalline materials such as lanthanum-strontium-cobalt oxide, strontium ruthenate, strontium vanadate, or indium-doped tin oxide. The electrode of metallically conducting oxide and the ferroelectric dielectric are provided by standard techniques such as pulsed laser deposition (PLD), sputtering, molecular beam epitaxy (MBE) or metal organic chemical vapour deposition (MOCVD). The materials may be provided on a non-crystalline substrate; preferably, however, the metallically conducting electrode is provided on a monocrystalline substrate. The monocrystalline substrates preferably have an acceptable lattice matching (+/−10%) with the conducting oxides and the ferroelectric dielectric which are used. It is comparatively simple then to provide a ferroelectric dielectric epitaxially. Examples of materials which may be used for the monocrystalline substrate are strontium titanate, magnesium oxide, magnesium-aluminium oxide, or lithium niobate. However, substrates of silicon or gallium arsenide may also be used with suitable buffer layers such as, for example, $Pr_6O_{11}$ or $CeO_2$.

In a further embodiment, the dielectric comprises two or more layers of ferroelectric materials which change the direction of their remanent polarization at different electric switching fields. The tunnel diode then has more than two switching states. The dielectric may be grown, for example, in the form of two layers with different ferroelectric properties on a first electrode. A second electrode is then provided on said layers.

In a further embodiment, the tunnel diode comprises an electrode on which a layer of a ferroelectric material with an electrode has been provided more than once, so that the tunnel diode comprises a number of diodes connected in series. The tunnel diode now has an $M(FM)^n$ structure, where M represents an electrode, F a ferroelectric dielectric, while the index n indicates that the combination (FM) comprising the ferroelectric dielectric F and the electrode M is repeated n times, whereby a series circuit of MFM elements is created. The dielectric need not have the same thickness each time. Since the dielectric is comparatively thin for rendering a tunnel current possible, a short-circuit between the electrodes may occasionally arise in a dielectric between two electrodes owing to so-called pinholes. Short-circuit between the electrodes means failure of the tunnel diode in the case of a single dielectric. In the tunnel diode according to this embodiment, the occurrence of pinholes in a single dielectric is no longer fatal to the tunnel diode. The reliability of the tunnel diode accordingly increases.

When the tunnel diode comprises a number of elements connected in series, and more than two different switching states are desired, according to the invention, the layers comprise different ferroelectric materials which change the directions of their remanent polarization at different electric switching fields. The tunnel diode then has more than two switching states. A tunnel diode then comprises, for example, a structure such as MFMF'M or M(FMF'M)$^n$, where F and F' are ferroelectric materials which change the directions of their remanent polarization at different electric switching fields. Depending on the value and direction of the remanent polarizations of the ferroelectric dielectrics F and F', the tunnel current will increase or decrease. The tunnel diode then has more than two switching states. Such a tunnel diode has a high reliability. The presence of an electrode between two dielectrics in addition prevents coupling of dielectric domains in the two ferroelectric materials.

The invention also relates to a memory element which comprises a tunnel diode according to the invention. Known memory elements comprise capacitances, the value of the charge on each capacitance being a measure for the information. Reading-out of known memory elements is difficult. A certain voltage is applied to a capacitance during read-out, after which the charge flowing towards the capacitance is measured. The value of this charge is a measure for the charge which was present in the capacitance. The information originally present has disappeared after read-out, so that it has to be written into the capacitance again. In a memory element according to the invention, a voltage is applied across the memory element during read-out, after which the current through the element is measured. Measuring a current is much easier than measuring a charge. The information in the memory element is not affected by the read-out. The read-out procedure for a memory element according to the invention, therefore, is much simpler than the procedure for a known memory element.

BRIEF DESCRIPTION OF THE DRAWING FIGURES

The invention will be explained in more detail below by way of example with reference to an embodiment with the accompanying diagrammatic drawing, in which.

Figure 3:
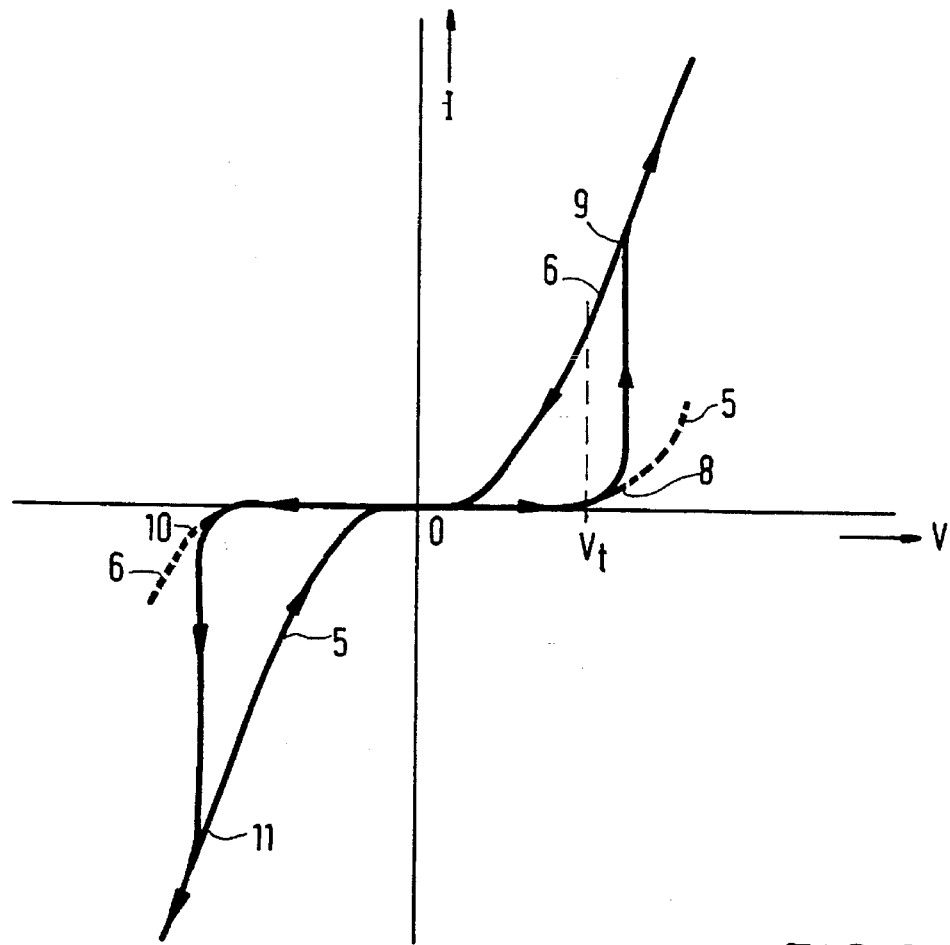
Figure 4:
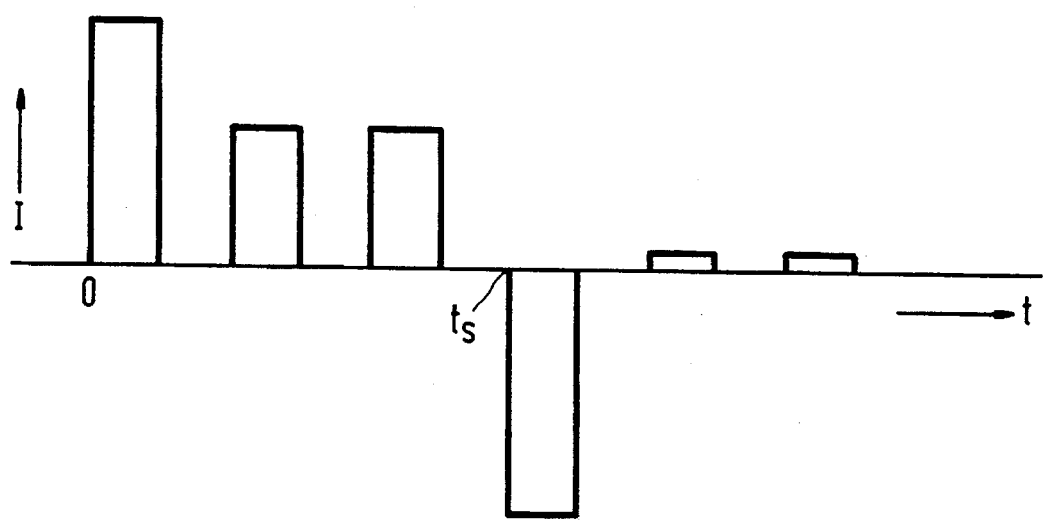
Figure 5:
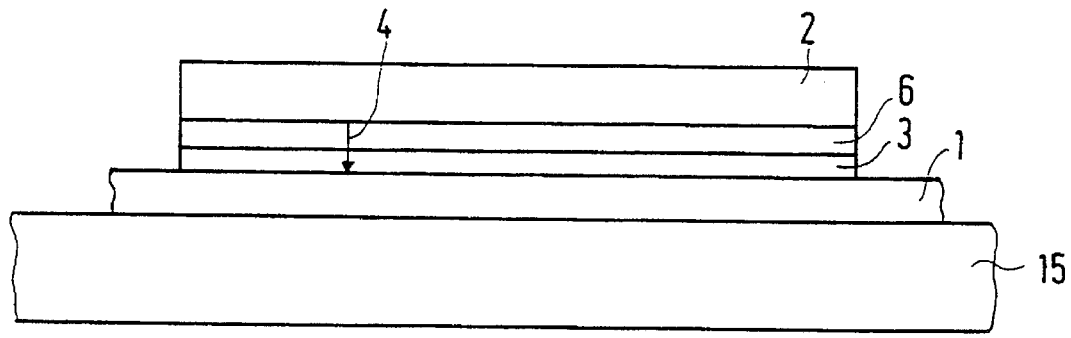
Figure 6:
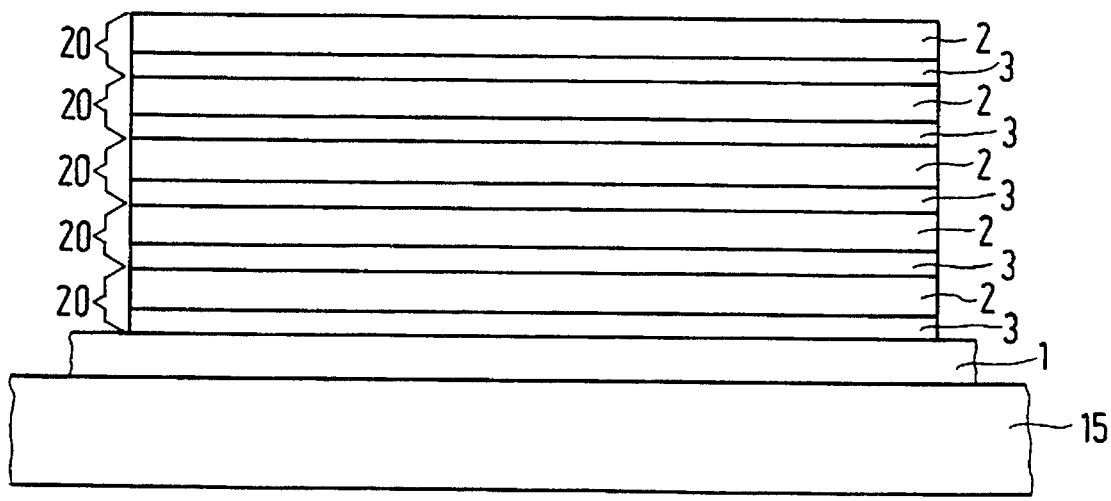

FIG. 3 shows a current-voltage characteristic of a tunnel diode according to the invention, FIG. 4 shows write-read cycles for a memory element according to the invention, FIG. 5 shows a tunnel diode according to the invention in which the dielectric comprises two ferroelectric materials with different electric switching fields, and FIG. 6 shows a tunnel diode according to the invention which comprises a number of elements connected in series.

The Figures are purely diagrammatic and not drawn to scale. Corresponding components have generally been given the same reference numerals in the Figures.

DESCRIPTION OF THE INVENTION

Figure 1:
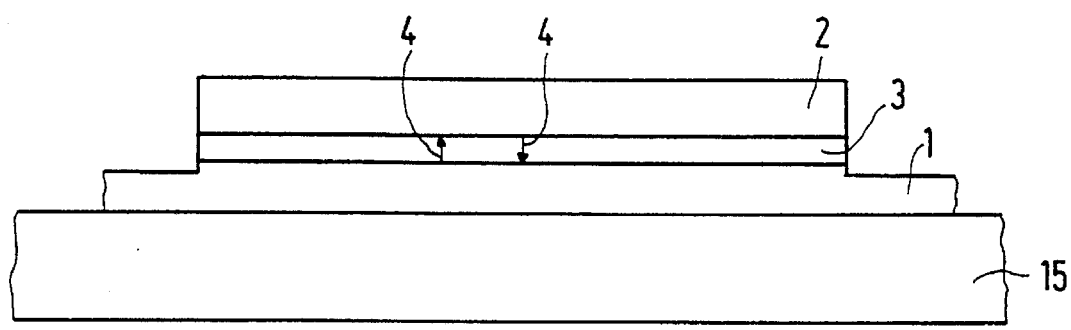
FIG. 1 shows a tunnel diode according to the invention.

FIG. 1 shows a tunnel diode provided with two electrodes 1, 2 in the form of substantially parallel plates, with an insulating dielectric 3 in between which forms a barrier with a barrier level for electrons and which has thickness such that electrons can tunnel through the barrier from the one to the other electrode at a voltage greater than a threshold voltage. The invention also relates to a memory element.

Figure 2:
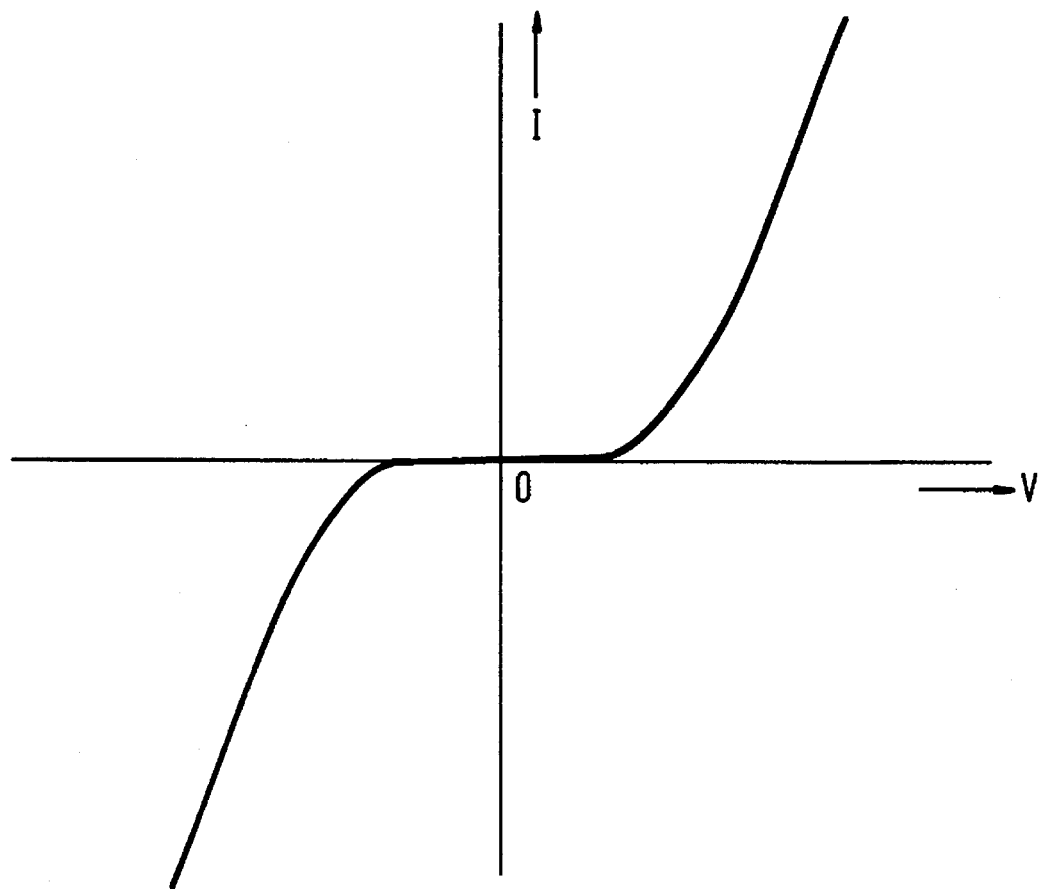
FIG. 2 shows a current-voltage characteristic of a known tunnel diode.

Such a diode is known as a tunnel device or MIM ("metal-insulator-metal") or MIS ("metal-insulator-semiconductor") diode. The term metal is understood to mean a well-conducting material. Since the charge transport is carried out by electrons in tunnel devices, such switching elements are fast, so that tunnel diodes are highly suitable for use at high frequencies. FIG. 2 shows a current-voltage characteristic of an MIM diode in which the current I through the diode is plotted as a function of the voltage V across the electrodes 1, 2. The current-voltage characteristic is symmetrical around zero volts in the case of two identical electrodes.

The known tunnel diode has no memory. It is desirable in many applications for the tunnel diode to hold a certain switching state, such as open/closed, under practical conditions such as room temperature. This means that more than one value of the current through the tunnel diode is possible for one given voltage across the electrodes 1, 2, depending on the switching state of the diode.

According to the invention, the dielectric 3 comprises a layer of a material which is ferroelectric at room temperature with a remanent polarization which influences the barrier level. The tunnel diode then has various switching states depending on the remanent polarization of the dielectric. The value and the direction of the polarization strengthen or weaken the influence of an electric field to be applied between the electrodes, and thus influence the barrier and the tunnel current. The polarization of the dielectric may be parallel or antiparallel to an electric field to be applied between the electrodes. Given a certain voltage at the electrodes, therefore, more or less tunnel current may flow through the tunnel diode, depending on whether the remanent polarization of the ferroelectric dielectric is parallel or antiparallel to the electric field in the dielectric 3. The tunnel diode then has two different switching states. The ferroelectric dielectric may be switched from one polarization state into another in that a voltage is applied across the dielectric such that an electric switching field of the ferroelectric material is exceeded in the dielectric. Since the switching state is determined by the remanent polarization of the dielectric, this switching state is held until the polarization state of the dielectric changes. FIG. 3 shows a current-voltage characteristic of a tunnel diode according to the invention with two identical electrodes. This current-voltage characteristic is composed of two curves 5, 6 which correspond to the different directions of the remanent polarization.

When there is no voltage V applied to the tunnel diode, no current I flows through the element (point 0 in FIG. 3). When the voltage V across the dielectric 3 rises and the remanent polarization counteracts the influence of the electric field (the polarization is then antiparallel to the applied electric field), the current rises in accordance with curve 5. The switching field for switching over the polarization is reached in the ferroelectric dielectric at point 8 on curve 5. The remanent polarization in the ferroelectric dielectric then changes from antiparallel to parallel relative to the electric field. The current through the tunnel diode then rises until point 9 on curve 6 is reached. When the voltage is increased further, the current will rise in accordance with curve 6 until the dielectric breaks down. When the voltage drops after reaching point 9, the current will follow curve 6. When point 10 on curve 6 is reached, the electric field has become so great that the polarization of the dielectric changes direction again. The current then drops until the value belonging to point 11 on curve 5 is reached. When the voltage drops further, the current will drop along curve 5 until the dielectric breaks down. If the voltage rises after reaching point 11, the current will follow curve 5.

In practice, the tunnel diode is switched in that a voltage pulse is applied across the dielectric of such a value that the remanent polarization of the dielectric changes. The tunnel diode is then read out at voltages lower than the voltage belonging to the switching field of the remanent polarization.

FIG. 4 shows write-read cycles of the tunnel diode. Time t is plotted on the horizontal axis, and current I through the tunnel diode on the vertical axis. At moment t=0, a positive voltage pulse of such value is applied to the electrodes that the switching field of the dielectric 3 is exceeded, so that the polarization direction is parallel to the electric field for positive voltages across the electrodes (curve 6, FIG. 3). For reading-out the switching state of the tunnel diode, a square-wave voltage with an amplitude between 0 and $+V_t$ is then applied to the electrodes 1, 2 (see FIG. 3). A comparatively strong current flows through the tunnel diode then. The tunnel diode is closed. At moment $t=t_S$, a negative voltage pulse is applied to the electrodes of such value that the switching field of the dielectric 3 is exceeded, so that the polarization direction is antiparallel to the electric field for positive voltages across the electrodes (curve 5, FIG. 3). For reading-out the tunnel diode if the switching element, a square-wave voltage with an amplitude between 0 and $+V_t$ is then applied to the electrodes 1, 2 (see FIG. 3). A comparatively weak current I flows through the tunnel diode then. The tunnel diode is open.

The thickness of the dielectric may be comparatively great if there are so-called traps in the dielectric through which electrons can tunnel through the dielectric ("trap assisted tunnelling"). Such a dielectric, however, is difficult to manufacture. Preferably, the thickness of the dielectric 3 is chosen to be smaller than 100 Å. Tunnelling of electrons through the dielectric 3 is then possible at comparatively low voltages without the use of traps.

The value and direction of the remanent polarization strengthen or weaken the influence of an electric field to be applied between the electrodes 1, 2, and thus influence the barrier and the tunnel current. In an embodiment, a tunnel diode is used in which the two electrodes 1, 2 are in the form of two flat parallel plates. According to the invention, the direction 4 of the greatest component of the remanent polarization is substantially parallel to these plates. The direction 4 of the remanent polarization is then parallel or antiparallel to the electric field. The effect of the polarization on the value of the barrier is then at its maximum.

An additional advantage is obtained when the ferroelectric dielectric 3 is provided epitaxially on an electrode 1 of a monocrystalline, metallically conducting oxide. The dielectric 3 then has a structure such that the value of the remanent polarization is a maximum, while the polarization direction 4 is parallel to the electric field to be applied between the electrodes 1, 2. The metallically conducting oxide layers comprise, for example, monocrystalline materials such as lanthanum-strontium-cobalt oxide, strontium ruthenate, strontium vanadate, or indium-doped tin oxide. The electrode 1 of metallically conducting oxide and the ferroelectric dielectric 3 are provided by standard techniques such as pulsed laser deposition (PLD), sputtering, molecular beam epitaxy (MBE), or metal organic chemical vapour deposition (MOCVD).

The materials may be provided on a non-crystalline substrate 15. Preferably, however, the metallically conducting electrode 1 is provided on a monocrystalline substrate 15. Such a monocrystalline substrate preferably has an acceptable matching (lattice dislocation +/–10%) with the conducting oxides of the electrode 1 used and the ferroelectric dielectric 3. It is comparatively simple then to provide an epitaxial ferroelectric dielectric 3. Materials which may be used for the monocrystalline substrate 15 are, for example, strontium titanate, magnesium oxide, magnesium-aluminium oxide, or lithium niobate. However, substrates of silicon or gallium arsenide with suitable buffer layers such as, for example, $Pr_6O_{11}$ or $CeO_2$ may also be used.

An embodiment of the tunnel diode is manufactured as follows. A monocrystalline strontium titanate crystal is used for the substrate 15. Such a crystal has an acceptable matching (1.5%) relative to the strontium ruthenate used for the electrode 1. The strontium ruthenate is provided at 650° C. in an 0.2 mbar oxygen atmosphere by PLD. A layer of 80 Å monocrystalline lead-zirconium titanate (PZT) is provided as the ferroelectric dielectric 3 in the same manner as the strontium ruthenate of the electrode 1. A typical composition of lead-zirconium titanate obtained by the above process is $PbZr_{0.05}Ti_{0.95}O_3$. The layer 3 has an epitaxial structure then. The remanent polarization is approximately 75 $\mu C/cm^2$. A second layer of strontium ruthenate is provided so as to form the second electrode 2 on the lead-zirconium titanate layer 3 in a manner analogous to that for electrode 1. The electrode 2 and the dielectric 3 are then patterned by means of a standard lithography process and through etching, i.e. reactive ion etching or Ar ion etching. The structure is etched through into the electrode 1.

A tunnel diode as shown in FIG. 1 has then been created with strontium ruthenate electrodes 1, 2 and an 80 Å thick lead-zirconium titanate dielectric 3. The switching points 8, 10 of FIG. 3 lie at approximately 0.1 V in such an element.

In a further embodiment, the dielectric 3 comprises several ferroelectric materials which change the direction of their remanent polarization at different electric switching fields. The tunnel diode then has more than two switching states. FIG. 5 shows a tunnel diode in which the dielectric 3 was grown on a first electrode in the form of two layers 3, 6 with different ferroelectric properties. On this dielectric 3, 6, a second electrode 2 is provided. As an example, a strontium titanate substrate 15 is taken again with a first electrode 1 of strontium ruthenate. A lead-zirconium titanate layer 3 of 50 Å is provided on this electrode 1 in a manner analogous to that of the first embodiment. A second ferroelectric layer 6 of lead-zirconium titanate is provided on this layer 3 in the manner described in embodiment 1, the composition being so chosen in known manner that a different switching field and remanent polarization are realised in this layer compared with the lead-zirconium titanate layer 3. The dielectric 3 has a switching field of 100 kV/cm and a remanent polarization of 75 $\mu C/cm^2$. The dielectric 6 has a switching field of 30 kV/cm and a remanent polarization of 25 $\mu C/cm^2$. Such a tunnel diode has four switching states depending on the directions of the remanent polarizations of the dielectrics. When we indicate the polarization direction 4 with → and ← for a polarization directed from electrode 1 to 2 or vice versa, respectively, then the four switching states are: no. 1: dielectric 3→dielectric 6→; no. 2: dielectric 3→dielectric 6←; no. 3: dielectric 3←dielectric 6→; no. 4: dielectric 3←dielectric 6←. If the remanent polarizations have the same value, there are only three switching states; switching states no. 2 and 3 are identical. The tunnel diode may alternatively have more than two different ferroelectric dielectrics. In that case the tunnel diode will have correspondingly more switching states.

FIG. 6 shows a further embodiment in which the tunnel diode comprises an electrode 1 on which a ferroelectric dielectric 3 with electrode 2 has been provided more than once, so that the tunnel diode comprises a number of elements 20 connected in series. The tunnel diode then has an $M(FM)^n$ structure, where M is an electrode 1, 2, F a ferroelectric dielectric 3, and the index n indicates that the combination 20 (FM), comprising the ferroelectric dielectric F and the electrode M, is repeated n times. Since the dielectric 3 is comparatively thin for rendering possible a tunnel current, a short-circuit between the electrodes may sometimes occur in a dielectric 3 between two electrodes 1, 2 or 2, 2 owing to pinholes. This will take place especially if the thickness of dielectric is smaller than 20 Å. With a single dielectric 3, a short-circuit between the electrodes means failure of the tunnel diode. In this embodiment of the tunnel diode, the occurrence of pinholes in a single dielectric 3 is no longer fatal to the tunnel diode. The reliability of the tunnel diode therefore increases. An additional advantage is that the switching voltage of the element becomes n times higher than the switching voltage of a tunnel diode comprising one element 20. The tunnel diode may thus be adapted to a desired switching voltage.

If more than two different switching states are desired, the dielectrics 3 of the embodiment of FIG. 6 comprise different ferroelectric materials which change the directions of their remanent polarizations at different electric switching fields. The tunnel diode then has more than two switching states. A tunnel diode then comprises, for example, a structure such as MFMF'M or $M(FMF'M)^n$, where F and F' are ferroelectric materials which change the directions of their remanent polarization at different electric switching fields. Depending on the value and direction of the remanent polarizations of the ferroelectric dielectrics F and F', the tunnel current will become stronger or weaker, so that the tunnel diode has more than two switching states. The ferroelectric dielectrics described with reference to the embodiment of FIG. 5 may also be used in this embodiment.

The invention also relates to a memory element comprising a tunnel diode according to the invention. Known memory elements comprise many capacitances, the value of charge on the capacitances being a measure for the information. The read-out of known memory elements is difficult. During read-out, a certain voltage is applied to a capacitance, after which the charge flowing towards the capacitance is measured. The value of this charge is a measure for the charge which was present in the capacitance. After the read-out, the information originally present has disappeared, so that the information originally present has to be written into the capacitances again. In a memory element according to the invention, a voltage is applied to the memory element during read-out, after which the current through the element is measured (see FIG. 4). Measuring a current is much simpler than measuring a charge. The information in the memory element is not affected by the read-out. The read-out procedure for a memory element according to the invention is much simpler therefore than is the procedure for a known memory element. In practice, the memory element is switched from one memory state into another in that a voltage pulse is applied across the dielectric of such a value that the remanent polarization of the dielectric or, if several dielectrics are present, of one of the dielectrics changes. The memory element is then read out through measurement of the current through the tunnel diode at voltages lower than the voltage belonging to a switching field of the remanent polarization of the dielectric 3.

The invention is not limited to the embodiments described above. Thus, instead of a single tunnel diode, many tunnel diodes may be present on the substrate 15, while besides the tunnel diodes also other elements such as transistors, resistors, or capacitors may be present. In other words, the tunnel diode may form part of an integrated circuit.

The embodiments described related to symmetrical tunnel diodes. Alternatively, however, different materials may be taken for electrode 1 and electrode 2, for example, a conductive oxide for electrode 1 and a metal for electrode 2. The current-voltage characteristic of such a tunnel diode is asymmetrical.

The ferroelectric dielectric may be combined with non-ferroelectric materials. Thus the dielectric 3 may comprise a thin layer of ferroelectric material and in addition a thin insulating or semiconducting layer. The voltage level at which switching takes place may be influenced thereby, or the effect of the switching, i.e. the value of the current through the tunnel diode, may be influenced. It is also possible to combine the ferroelectric dielectric with an antiferroelectric dielectric. It is possible in this manner to realize additional switching states for the tunnel diode. The tunnel diode may also be used as a component of a tunnel transistor. For this purpose, for example, a tunnel diode according to the invention, represented by MFM (with M: electrode 1, F: ferroelectric dielectric, M: electrode 2), is combined with an MIM (with I: insulating dielectric) into a tunnel transistor, represented by $M_1FM_2IM_3$, an additional dielectric and a third electrode being provided on a tunnel diode according to the invention. Electrode 2 ($M_2$) of the tunnel diode according to the invention then at the same time is an electrode of the MIM. A tunnel transistor is thus created in which the emitter connection is formed by $M_1$, electrode 1 of the MFM, the base connection by $M_2$, electrode 2 of the MFM, which at the same time forms an electrode of the MIM, and the collector connection by $M_3$, the further electrode of the MIM. It is also possible to combine the tunnel diode according to the invention with semiconducting p- or n-type regions. An MFPNM structure then arises, with P and N a p- and n-type conducting semiconductor material, respectively. In this case the electrode 1 acts as the emitter connection, the p-type region as the base region, and the n-type region as the collector region. The above tunnel transistors have a memory function, i.e. they are capable of holding certain switching states.

We claim:

1. A tunnel diode comprising two metallically conducting electrodes with an insulating dielectric in between, said insulating dielectric forming a barrier with a barrier level for electrons and having a thickness such that electrons can tunnel through the barrier from the one to the other electrode at a voltage higher than a threshold voltage, characterized in that the dielectric comprises a layer of a material being ferroelectric at room temperature with a remanent polarization influencing the barrier level to achieve several switching states according to said remanent polarization.

2. A tunnel diode as claimed in claim 1, wherein the thickness of the layer of ferroelectric material is below 100 Å.

3. A tunnel diode as claimed in claim 1, wherein the thickness of the layer of ferroelectric material is greater than 20 Å.

4. A tunnel diode as claimed in claim 1, wherein the direction of a greatest component of the remanent polarization is substantially perpendicular to plates of said electrodes.

5. A tunnel diode as claimed in claim 1, wherein the layer of ferroelectric material is an epitaxial layer disposed on an electrode of a monocrystalline, metallically conducting oxide.

6. A tunnel diode in claim 5, wherein the metallically conducting electrode is disposed on a monocrystalline substrate.

7. A tunnel diode as claimed in claim 1, wherein the dielectric comprises at least two layers of ferroelectric materials, each of said layers having different directions of remanent polarization and different electric switching fields.

8. A tunnel diode structure comprising a number of tunnel diodes as claimed in claim 1, said number of tunnel diodes being connected in series, characterized in that each tunnel diode comprises a layer of said ferroelectric material disposed on a first of said electrodes together with a second of said electrode disposed thereon and being a first electrode to a next tunnel diode of said number.

9. A tunnel diode as claimed in claim 8, wherein the layers of ferroelectric material comprise different ferroelectric materials which change the directions of their remanent polarization at different electric switching fields.

10. A memory element, characterized in that the memory element comprises a tunnel diode element as claimed in claim 1, in which current is measured and information is unaffected by read-out.

11. A tunnel diode as claimed in claim 8, wherein the layers of ferroelectric material have different thicknesses.

12. A tunnel diode as claimed in claim 8, wherein said number is greater than 2.

* * * * *